(12) United States Patent
Lashmore

(10) Patent No.: US 10,720,542 B2
(45) Date of Patent: Jul. 21, 2020

(54) BORON NITRIDE CARBON ALLOY SOLAR CELLS

(71) Applicant: University of New Hampshire, Durham, NH (US)

(72) Inventor: David S. Lashmore, Lebanon, NH (US)

(73) Assignee: University of New Hampshire, Durham, NH (US)

(*) Notice: Subject to any disclaimer, the term of this patent is extended or adjusted under 35 U.S.C. 154(b) by 0 days.

(21) Appl. No.: 15/970,114

(22) Filed: May 3, 2018

(65) Prior Publication Data

US 2018/0301579 A1   Oct. 18, 2018

Related U.S. Application Data

(63) Continuation of application No. PCT/US2016/060971, filed on Nov. 8, 2016.
(Continued)

(51) Int. Cl.
*H01L 31/036* (2006.01)
*H01L 31/0687* (2012.01)
(Continued)

(52) U.S. Cl.
CPC .......... *H01L 31/0687* (2013.01); *C01B 35/14* (2013.01); *H01L 31/032* (2013.01);
(Continued)

(58) Field of Classification Search
CPC .................... H01L 31/0687; H01L 31/048
(Continued)

(56) References Cited

U.S. PATENT DOCUMENTS 4,241,493 A * 12/1980 Andrulitis ............. H01L 31/048
                                                          136/251
4,385,198 A *  5/1983 Rahilly ................ H01L 31/0288
                                                          136/249
(Continued)

FOREIGN PATENT DOCUMENTS

WO   2010/006080   1/2010
WO   2017/083293   5/2017

OTHER PUBLICATIONS

Huang et al, (Carbon doped BN nanosheets for metal-free photoredox catalysis), 2015.*
(Continued)

*Primary Examiner* — Niki Bakhtiari
(74) *Attorney, Agent, or Firm* — Finch & Maloney PLLC

(57) ABSTRACT

Solar cells fabricated from p-n junctions of boron nitride nanotubes alloyed with carbon are described. Band gaps of boron nitride carbon alloys are tailored by controlling carbon content in the boron nitride nanotubes. High efficiency solar cells can be fabricated by tailoring the band gap of boron nitride carbon alloy nanotubes, and using these nanotubes for fabricating solar cells u. Because boron nitride carbon alloy nanotubes are transparent to most wavelengths of light, the wavelengths not converted to electrons (i.e., absorbed) at a first p-n junction in a solar cell will pass through the stack to another p-n junction in the stack having a different band gap. At each successive p-n junction, each of which has a different band gap from the other p-n junctions in the stack, more wavelengths of light will be converted into electricity. This dramatically increases the efficiency of solar cells.

15 Claims, 4 Drawing Sheets

Related U.S. Application Data

(60) Provisional application No. 62/252,781, filed on Nov. 9, 2015.

(51) Int. Cl.
*C01B 35/14* (2006.01)
*H01L 31/032* (2006.01)
*H01L 31/0352* (2006.01)
*H01L 31/048* (2014.01)
*B82Y 30/00* (2011.01)

(52) U.S. Cl.
CPC .... *H01L 31/036* (2013.01); *H01L 31/035227* (2013.01); *H01L 31/048* (2013.01); *B82Y 30/00* (2013.01); *C01P 2002/52* (2013.01); *C01P 2004/13* (2013.01); *C01P 2006/40* (2013.01); *Y02E 10/544* (2013.01)

(58) Field of Classification Search
USPC .................................................. 136/243–265
See application file for complete search history.

(56) References Cited

U.S. PATENT DOCUMENTS

| | | |
|---|---|---|
| 5,895,938 A | 4/1999 | Watanabe et al. |
| 2009/0014055 A1* | 1/2009 | Beck ................ H01L 31/02168 136/246 |

OTHER PUBLICATIONS

Baleeswaraiah Muchharla et al., "Tunable Electronics in Large-Area Atomic Layers of Boron-Nitrogen-Carbon", NANO Letters, Jul. 16, 2013, vol. 13, Issue 8, pp. 3476-3481.

Qing Peng et al., "Tunable band gaps of mono-layer hexagonal BNC heterost ructures", Science Direct, Apr. 12, 2012. vol 44. pp. 1662-1666, see Section 1-4.

Yingcai Fan et al., "Electronic properties of BN/C nanotube heterostructures", Journal of Applied Physics, May 6, 2010, vol. 107, Issue 9, pp. 1-5.

International Search Report and Written Opinion received for Patent Application No. PCT/US2016/060971, dated Feb. 21, 2017, 13 pages.

International Preliminary Report on Patentability received for Patent Application No. PCT/US2016/060971, dated May 24, 2018, 11 pages.

* cited by examiner

BORON NITRIDE CARBON ALLOY SOLAR CELLS

RELATED APPLICATIONS

This application is continuation of PCT Appl. No. PCT/US16/60971, filed on Nov. 8, 2016, which claims benefit of U.S. Provisional Appl. No. 62/252,781, both of which are incorporated by reference herein in their entireties.

BACKGROUND

The present disclosure relates generally to high efficiency and mechanically durable solar cells. Specifically, the present disclosure relates to solar cells fabricated from boron nitride, and, in particular, boron nitride carbon alloys.

Most commercially available solar cells convert about 12% of incident sunlight energy into electricity. This relatively low conversion rate of incident sunlight to electricity (often referred to as "efficiency") is a significant factor in the cost of renewable energy generated from solar cells.

One cause of the low efficiency of conventional solar cells is the relatively narrow band gap used in the semiconductor devices of conventional solar cells. That is, semiconductor materials generally used to fabricate commercial solar cells have band gaps from between 1.1 eV to 1.7 eV. For "single junction" solar cells, in which constituent p-n junctions use a single type of p material and a single type of n material for all p-n junctions in the solar cell, the band gap is narrow—on the order of several tenths of an electron volt (eV) centered around the band gap at the interface between the materials used to make the junction. This narrow range of energy in the band gap results in a narrow range of wavelengths present in the spectrum of sunlight that can be converted to electricity by the solar cell.

Further complicating this is that the spectrum of sunlight available for conversion at the Earth's surface is not continuous over a spectrum of wavelengths. Sunlight transmitted in the vacuum of space can be approximated as black body radiation, which includes a continuous range of wavelengths of light. Sunlight received at the Earth's surface, however, has interacted with components of the Earth's atmosphere. As a result, many wavelengths of light originally present in sunlight (i.e., when in the vacuum of space) are absorbed by components of the atmosphere before reaching the Earth's surface. This complicates the efficient conversion of sunlight into electricity using conventional solar cells because some solar cells may be configured to convert wavelengths of light to electricity that have been absorbed by the Earth's atmosphere prior to reaching the solar cell.

Multi junction solar cells that include a variety of band gaps in the constituent p-n junctions are configured to convert a wider range of wavelengths to electricity. However, the interfaces of p-n junctions of multi junction solar cells must be epitaxial, which substantially increases the cost of solar cell fabrication.

SUMMARY

Example 1 of the present disclosure includes a solar cell that includes a first layer of boron nitride carbon alloy having an n-type dopant; and a second layer of boron nitride carbon alloy having a p-type dopant, the second layer in contact with the first layer to form a p-n junction, wherein a first band gap of the first layer and a second band gap of the second layer are each determined by a first carbon content of the alloy of the first layer and a second carbon content of the alloy of the second layer, respectively. Example 2 of the present disclosure includes the subject matter of Example 1, further comprising a third layer of boron nitride carbon alloy having an n-type dopant, the third layer in contact with the second layer, wherein a third band gap of the third layer is different from the first band gap of the first layer and different from the second band gap of the second layer, the third band gap of the third layer determined by a third carbon content of the alloy of the third layer. Example 3 includes the subject matter of any of claim 1 or 2, wherein the boron nitride carbon alloy comprises boron nitride carbon alloy nanotubes. Example 4 of the present disclosure includes the subject matter of Example 2, wherein an interface between the second layer and the third layer converts a first range of light wavelengths into electricity, the first range of wavelengths transmitted through the first layer and the second layer. Example 5 of the present disclosure includes the subject matter of any of Examples 1-4, wherein an efficiency of the solar cell is greater than 50%. Example 6 of the present disclosure includes the subject matter of any of Examples 1-5, wherein the first layer and the second layer are transmit greater than 50%, 60%, 70%, 80%, 90% or 95% of light in the range of from 400 to 700 nm. Example 7 of the present disclosure includes the subject matter of any of Examples 1-6, wherein the boron nitride carbon alloys of the first layer and the second layer comprises boron atoms and nitrogen atoms arranged in an array of hexagonal unit cells; and carbon atoms substituted for at least one of a first portion of boron atoms and a second portion of nitrogen atoms. Example 8 of the present disclosure includes the subject matter of Example 7, wherein lattice parameters of a hexagonal unit cell changes less than 5% upon substitution of a carbon atom for either one of a boron atom or a nitrogen atom. Example 9 of the present disclosure includes the subject matter of Example 7, wherein carbon atoms are disposed at a lattice site formerly occupied by one of a boron atom and a nitrogen atom. Example 10 of the present disclosure includes the subject matter of Example 7, wherein carbon atoms are not disposed at interstitial sites of a boron nitride nanotube crystal. Example 11 of the present disclosure includes the subject matter of any of Examples 1-10, wherein the solar cell has a density of less than 1.0 g/cc. Example 12 of the present disclosure includes the subject matter of any of Examples 1-11, wherein the solar cell can convert three separate wavelengths of light to electricity, the three separate wavelengths of light spaced from one another by at least 100 nm. Example 13 of the present disclosure includes the subject matter of any of Examples 1-12, wherein the solar cell is a non-planar solar cell. Example 14 of the present disclosure includes the subject matter of Examples 1-13, wherein the non-planar solar cell has at least one arcuate portion. Example 15 of the present disclosure includes the subject matter of any of Examples 1-14, wherein one of the boron nitride carbon alloy layers comprises at least twice the carbon content of another boron nitride carbon alloy layer of the solar cell. Example 16 of the present disclosure includes the subject matter of any of Examples 1-14, in which the solar cell is greater than 12%, greater than 15% or greater than 20% efficient at conversion of sunlight to electricity. Example 17 of the present disclosure includes the subject matter of any of Examples 1-16, wherein a solar cell of any of the preceding claims comprising a housing, a front sheet and a back sheet.

Example 18 includes a method of converting sunlight to electricity, the method including exposing a first boron nitride carbon alloy layer and a second boron nitride carbon alloy layer to sunlight, the first layer comprising a first carbon concentration and the second layer comprising a second carbon concentration that may be the same or different from the first carbon concentration, one of the first layer and the second layer being p-doped and the other being n-doped; exposing a third boron nitride carbon alloy and fourth boron nitride carbon alloy layer to sunlight that has passed through the first layer and second layer, the third layer and the fourth layer each including carbon at a concentration different than that of the first and second layer; and producing an electric current at the junction of the first and second layer and at the junction of the third and fourth layer. Example 19 includes the subject matter of Example 18, wherein the layers are comprised of boron nitride carbon alloy nanotubes.

The figures depict various embodiments of the present disclosure for purposes of illustration only. One skilled in the art will readily recognize from the following discussion that alternative embodiments of the structures and methods illustrated herein may be employed without departing from the principles described herein.

DETAILED DESCRIPTION

Overview

Embodiments of the present disclosure include solar cells fabricated from p-n junctions of boron nitride ("BN") nanotubes that have been alloyed with carbon. Band gaps of boron nitride carbon ("BNC") alloys are tailored by controlling carbon content in the BN nanotubes. By tailoring the band gap of BNC alloy nanotubes and fabricating solar cells using appropriately tailored BNC alloys, high efficiency solar cells are fabricated. The high efficiency of BNC alloy solar cells has at least two sources. First, BNC alloy nanotubes have, in some embodiments, a band gap ($E_g$) tailored to match wavelengths of light most prevalent at the surface of the Earth. Second, in some embodiments, layers of BNC nanotube alloys are used to fabricate a solar cell stack. Each BNC nanotube alloy layer can have a different band gap configured to convert a particular wavelength (or range of wavelengths) into electricity. Because BNC alloy nanotubes are substantially transparent to most wavelengths of light, the wavelengths not converted to electrons (i.e., absorbed) at a first p-n junction will pass through the stack to another p-n junction in the stack having a different $E_g$. At each successive p-n junction, each of which can have a different band gap from the other p-n junctions in the stack, more wavelengths of light will be converted into electricity. This dramatically increases the efficiency of BNC nanotube alloy solar cells.

Boron Nitride and Boron Nitride Carbon Alloy Structure

Figure 1A:
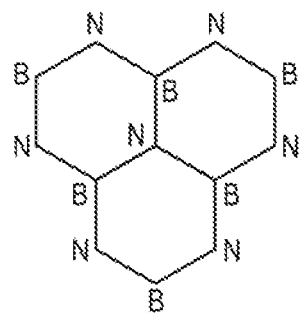
FIG. 1A is a schematic illustration of a structure of boron nitride in plan view, in an embodiment.

FIG. 1A illustrates the structure and composition of BN. BN and BNC alloys can occur in both nanotube and planar sheet allotropes. While embodiments of the present disclosure are generally directed to BN nanotubes alloyed with carbon, the structure in FIG. 1A (and FIG. 1B) are presented in a planar sheet configuration for convenience of explanation.

As shown, BN (whether occurring in a nanotube configuration or a planar sheet) is generally structured as adjacent hexagons. A single hexagon within a sheet is referred to herein as a "unit cell" when convenient. At each of the vertices of each hexagon is disposed one of either a boron atom or a nitrogen atom. Generally the boron and nitrogen are disposed at alternating vertices. The boron and nitrogen atoms are bonded together by $sp^2$ covalent bonds, with a slight ionic character to the bond caused by the relative electronegativities of the boron and nitrogen atoms.

A plurality of these hexagons, such as the ones shown in FIG. 1A, are bonded together to form a BN sheet or nanotube. BN sheets are, in some examples, formed macroscopically as one or more of (1) a monolayer (2) abi-layer, (3) a tri-layer. Structurally, BN sheets are comparable to the carbon allotrope graphene because of the hexagonal symmetry within a sheet and the formation of the sheets into monolayers, bilayers, trilayers, and combinations thereof. The inter-sheet spacing of bilayers or trilayers of BN is smaller than that of graphene. This is due to the partial ionic character of the $sp^2$ bonds between the boron and nitrogen atoms, which provides more inter-sheet attraction than is present between carbon graphene sheets. BN nanotubes are generally formed by a single layer of atoms configured into a tubular allotrope but can include more layers extending over some or all of a tube. For example, tubes may be singled walled, double walled, triple walled or multiwalled.

Figure 1B:
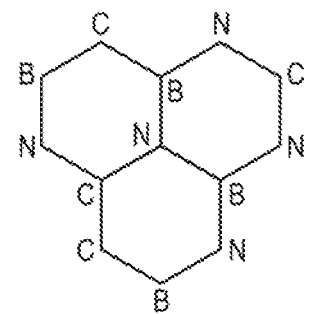
FIG. 1B is a schematic illustration of a structure of a boron nitride carbon alloy in plan view, in an embodiment.

FIG. 1B illustrates an example of a BNC alloy, in an embodiment. As in FIG. 1A, FIG. 1B is shown in a planar configuration for convenience of explanation even though some embodiments of the present disclosure described below are presented in the context of BNC alloy nanotubes used to fabricate solar cells. In FIG. 1B, some of the boron atoms and some of the nitrogen atoms in the BN structure have been substituted by carbon atoms. Because of the similarity in atomic size of boron (atomic number 10), carbon (atomic number 12), and nitrogen (atomic number 14), carbon atoms can substitute for either of boron atoms or nitrogen atoms within a single unit cell or within an array of unit cells of BN. This substitution forms a BN-carbon alloy in either one of a sheet or a nanotube and does not change the symmetry of the unit cells and does not change the dimensions of a unit cell (i.e., lattice parameters) by more than 5%.

Alloying BN with carbon is unlike doping intrinsic semiconductors with a dopant. In a semiconductor doping process, a semiconductor host is implanted with a dopant that is either a donor of electrons or a donor of holes. The donor, often implanted using a high energy ion beam, is inserted into the crystal structure of the host at an interstitial site or a crystallographic defect, such as a vacancy. Donor concentrations of dopants are in a range of parts per million with respect to the host composition. An example is implantation of arsenic (a hole donor) into silicon. The atomic size of arsenic is substantially smaller than silicon and therefore can conveniently fit into interstitial sites in the crystal structure of silicon.

Alloying BN with carbon is unlike this doping process in that carbon atoms substitute directly on lattice sites in the molecular structure for either boron atoms, nitrogen atoms, or both, without disturbing the BN unit cell. That is, carbon alloying atoms reside at a lattice site and not an interstitial site or defect location. In the boron nitride alloy, carbon atoms take the place of boron or nitrogen atoms in the lattice structure. Thus, carbon alloying atoms are present in the BN crystal structure in stoichiometric amounts.

Figure 2:
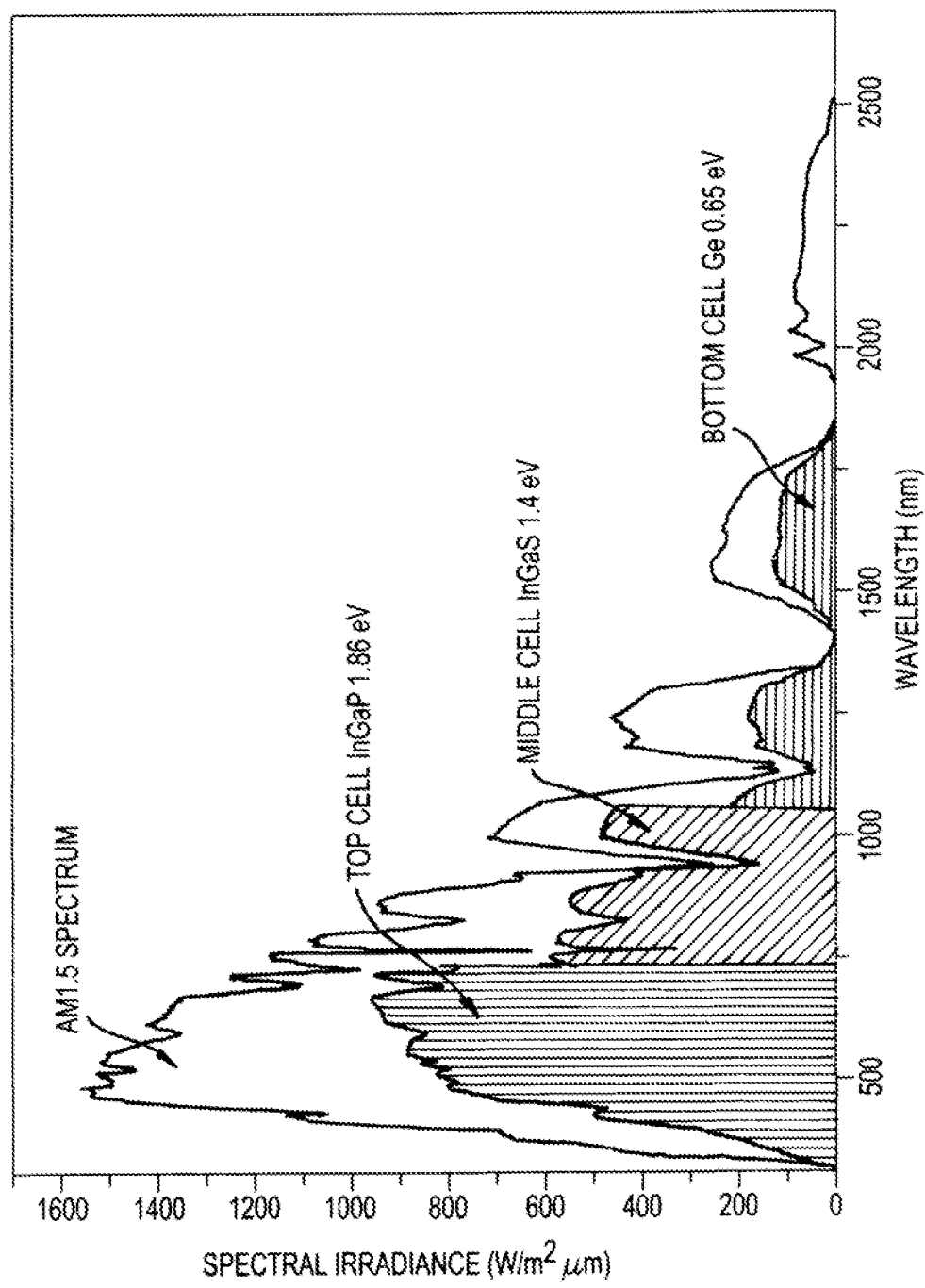
FIG. 2 is a graph of illumination power versus sunlight wavelength as measured at the Earth's surface, in an embodiment.

While the symmetry of BN is essentially unchanged upon alloying with carbon, the electronic structure does change. This will be explained in more detail in the context of FIG. 2

Figure 1C:
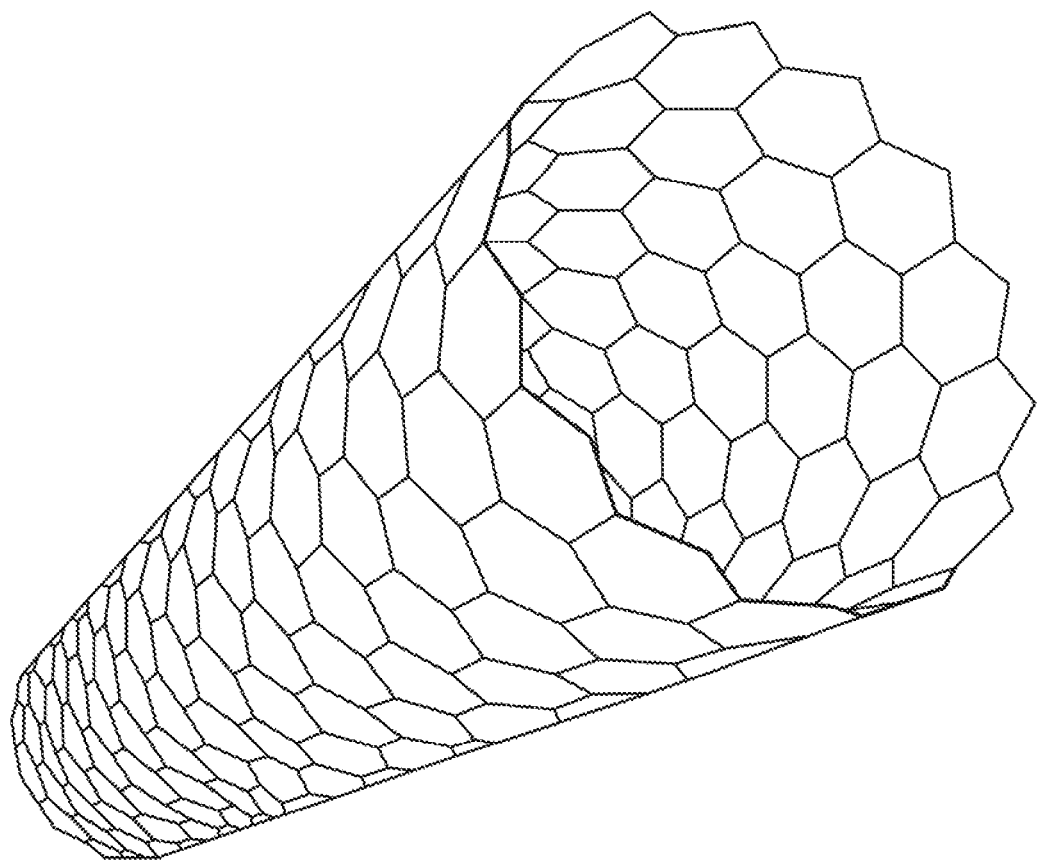
FIG. 1C is a schematic illustration of a structure of a boron nitride carbon alloy nanotube, in an embodiment.

FIG. 1C schematically shows a BNC alloy nanotube of the present disclosure. The hexagonal unit cell symmetry and composition of BN and BNC, as described above, is unchanged in nanotubes.

Boron Nitride Carbon Alloy Synthesis and Properties

Alloying of BN nanotubes with carbon is accomplished in any one of several possible fabrication methods. In one example method, the alloyed nanotubes can be made by forming the BNC alloyed nanotubes in situ, by substituting boron and carbon into a carbon nanotube (CNT), or by substituting carbon into a BN nanotube. In one example method, a plasma assisted chemical vapor deposition ("CVD") is used to react methyl chloride gas with nitrogen to produce BN nanotubes. In another example method, borazine gas is reacted in a plasma of a plasma CVD process to produce BN nanotubes. The BN nanotubes, regardless of the method used to produce them, are then alloyed with carbon by heating the nanotubes to approximately 800° C. in the presence of flowing ethylene gas or other carbon containing gas. In another example method, BN nanotubes are alloyed with carbon by dissolving Tetracyanoquinodimethane (TCNQ) in acetone. BN nanotubes are then dipped into the TCNQ acetone solution, with carbon substituting for boron and nitrogen atoms in the BN nanotube hexagonal structure, as described above. TCNQ doped BNC alloy nanotubes are n-doped. In different embodiments, a carbon alloyed BN nanotube can comprise greater than 1%, greater than 3%, greater than 5% or greater than 10% carbon, on a molar basis. Alloyed BNC nanotubes may be void of any other elements or may be essentially void of any other elements. For example, BNC nanotubes may consist of or consist essentially of carbon, boron and nitrogen.

BN monolayers and nanotubes have an $E_g$, prior to doping with carbon, of about 5.6 eV. Materials having a value of $E_g$ this high are typically considered insulators. However, upon alloying BN monolayers and/or nanotubes with carbon, the $E_g$ of BN monolayers and nanotubes changes as a function of carbon content. This enables BNC alloys to be synthesized into solar cells tailored to convert a range of wavelengths of sunlight into electricity.

Figure 3:
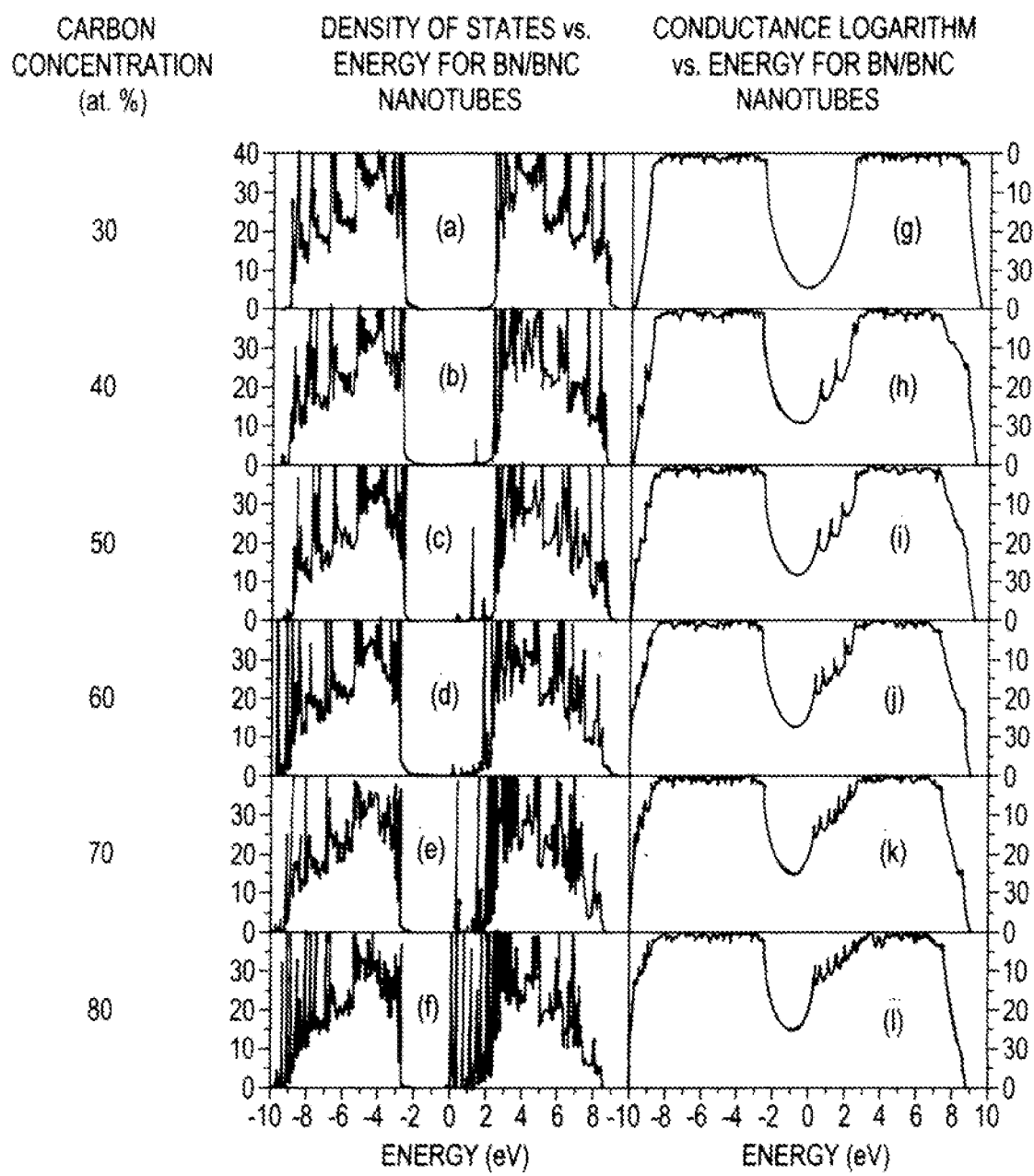
FIG. 3 is a graph of band gap ($E_g$) versus composition for a boron nitride carbon alloy, in an embodiment.

FIG. 3 is a graph showing band gap ($E_g$) versus composition for a boron nitride carbon alloy, in an embodiment. In embodiments, depending on the amount of carbon used to alloy BN nanotubes, $E_g$ of the resulting BNC alloy ranges from 0.7 eV to 2 eV. In some examples, a band gap of a BNC alloy can be adjusted by application of a transverse electric field. This graph can be found in Journal of Physics, volume 76, number 6, published June 2011.

Once fabricated, a BNC alloy is doped to p-type by simple exposure to oxygen. A BNC alloy, whether undoped or p-doped, can be converted to an n-type material by exposure to borazine, monovalent gold, TCNQ, and combinations thereof.

Boron Nitride Carbon Alloy Solar Cells

One feature of embodiments of the present disclosure, described above, is the high efficiency of solar cells comprising BN nanotubes. There are at least two reasons for this: (1) BNC alloys are mostly transparent (i.e., transmit greater than 50%, 60%, 70%, 80%, 90% or 95% of incident intensity) to many wavelengths of light (barring occasional scattering from crystal defects) including those from 400 nm to 700 nm and (2) the band gap of BNC nanotube alloys can be tailored over a very wide range of eV values. An example solar cell of the present disclosure that utilizes these two advantages is illustrated in FIG. 4.

Figure 4:
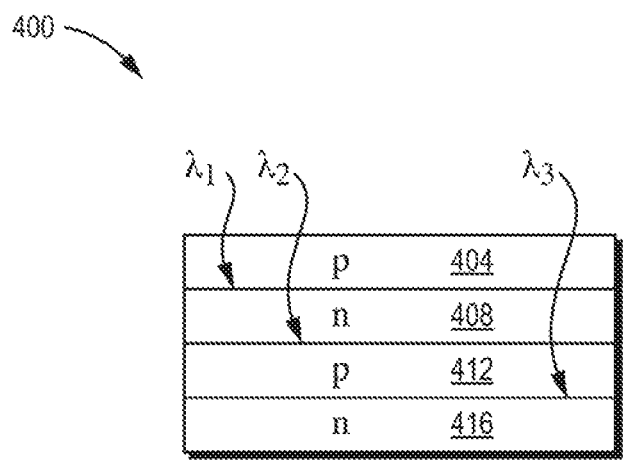
FIG. 4 is a schematic illustration of a solar cell of the present disclosure including multiple p-n junctions, each of which is designed to convert a different wavelength of sunlight to electricity, in an embodiment.

As shown in FIG. 4, an example solar cell 400 of the present disclosure includes a plurality of stacked layers, 404, 408, 412, and 416, each of which is fabricated from BNC alloy nanotubes that have been tuned with different carbon contents to have different band gaps. While four layers are shown in the example solar cell 400, other embodiments are not limited to four layers and may have more than four or fewer than four layers in a stack.

The layers 404, 408, 412, and 416 in the example solar cell 400 are alternately doped n-type and p-type. When configured in a stack, the alternating n-type and p-type layers form p-n junctions at each interface. Furthermore, as described above, the band gaps of the layers at each interface are configured to convert a particular range of wavelengths of light to electricity, as described above. Because the layers 404, 408, 412, and 416 are substantially transparent to most wavelengths of light, the solar cell 400 has an extremely high efficiency because any wavelength of light not converted to electricity at one interface travels deeper into the stack, for possible conversion to electricity at a different interface exhibiting a different band gap.

For convenience of explanation, light incident onto the solar cell 400 includes three wavelengths of light, $\lambda_1, \lambda_2, \lambda_3$. The layer 404 is doped p-type and the layer 408 is doped n-type. The BNC nanotube alloys in each of 404 and 408 are alloyed with a carbon content so that the corresponding band gap converts light of wavelength $\lambda_1$ to electricity. As with most BNC nanotube alloys, layers 404 and 408 are transparent to many wavelengths of light, permitting the transmission of light having wavelengths $\lambda_2, \lambda_3$ deeper into the stack of layers of the solar cell 400. As shown, the transmitted wavelength $\lambda_2$ travels to the interface between n-type layer 408 and p-type layer 412. Analogous to the p-n junction between layers 404 and 408, the p-n junction formed at the interface between layers 408 and 412 has a band gap designed (via carbon content) to absorb light having a wavelength $\lambda_2$. The light having a wavelength $\lambda_3$ is transmitted through the layers 408 and 412 to a p-n junction formed at the interface between layers 412 and 416. As shown, the layer 412 is doped p-type and the layer 416 is doped n-type. The band gap of the p-n junction formed by the interface of the layers 412 and 416 is configured (via carbon content) to convert light of wavelength $\lambda_3$ to electricity. In some embodiments, higher energy wavelengths are absorbed at deeper levels in the stack. In additional embodiments, some layers having the same or similar band gap may be repeated in a stack to capture light that was not absorbed at a higher level in the stack. In other embodiments, the bottom surface of the stack may include a mirror to reflect any transmitted light back upwards through the stack of BNC nanotube layers.

Consistent with the above example, the number of layers (and corresponding p-n junctions formed at the interfaces of the layers) and the associated band gaps are configurable to convert any desired range of light wavelengths to electricity. In some examples, the band gaps of the various p-n junctions are configured to convert some or all of the wavelengths of light available at the Earth's surface. In other examples, the p-n junctions are configured to maximize electricity production of black body radiation for space applications.

In some embodiments, the various layers of an example solar cell (such as the example solar cell 400) are fabricated from BNC alloy nanotube "felts" in which the constituent nanotubes are not oriented within a layer. In other examples, the layers are fabricated from BNC alloy nanotube fabrics in which the nanotubes are oriented either perpendicular to a horizontal plane of the layers (i.e., parallel to a z-axis) or parallel to the horizontal plane of the layers (i.e., parallel to an x-axis). In still other embodiments, the layers are fabricated from woven threads and/or fabrics of BNC alloys which are alloyed and doped according to embodiments of the present disclosure and placed into intimate contact to form p-n junctions. In some cases, the solar cell can be flexible. For example, the layers may be curved repeatedly to a radius of less than 1 meter, less than 10 cm or less than 1 cm. Single BNC alloy nanotubes can also be used in some embodiments to form p-n junctions, as described above.

Benefits and Advantages

Benefits of solar cells fabricated using BNC alloys according to the present disclosure include (1) a lighter weight than conventional silicon or III-V semiconductor solar cells owing to a BNC density of approximately 0.8 g/cc compared to densities of silicon and III-V semiconductors of approximately 2 to 4 g/cc. BNC alloys are also more flexible that conventional semiconductors, with BNC alloys able to be bent into a curved or arcuate conformation to a radius of curvature of several nanometers whereas conventional semiconductors are inflexible and brittle. This enables solar cells to be fabricated that conform to an underlying surface (even a non-planar underlying surface), have at least one arcuate portion, or are even cylindrical. BNC alloys are also thermally stable (with little or no change in physical or electrical properties) up to about 900° C. in air. This benefit is particularly advantageous in space applications (e.g., powering satellites) or other applications in which the service environment is demanding (e.g., military applications).

Another advantage of BNC alloys is their transparency to most of the visible, near IR, and near UV wavelengths of light (e.g., from approximately 100 nm to approximately 1000 nm). This transparency enables the layered configuration, and resulting high efficiency, described above.

BNC alloys are resistant to radiation, with little or no change in crystallographic structure, p-n junction structure, and mechanical properties even when exposed to radiation of space that is unfiltered by the Earth's atmosphere. This benefit is advantageous for space applications and is in distinct contrast to multi junction solar cells fabricated from conventional semiconductor materials that do degrade when exposed to space radiation.

BNC allows are mechanically stronger than conventional solar cell materials and can withstand the forces involved in a space launch.

In other examples, embodiments of the present disclosure are applied to produce a high fidelity display.

Further Considerations

The foregoing description of the embodiments of the disclosure has been presented for the purpose of illustration; it is not intended to be exhaustive or to limit the claims to the precise forms disclosed. Persons skilled in the relevant art can appreciate that many modifications and variations are possible in light of the above disclosure.

The language used in the specification has been principally selected for readability and instructional purposes, and it may not have been selected to delineate or circumscribe the inventive subject matter. It is therefore intended that the scope of the disclosure be limited not by this detailed description, but rather by any claims that issue on an application based hereon. Accordingly, the disclosure of the embodiments is intended to be illustrative, but not limiting, of the scope of the invention, which is set forth in the following claims.

What is claimed is:

1. A solar cell comprising:
   a plurality of alternating n-doped and p-doped layers comprising:
      a first layer of boron nitride carbon alloy nanotubes having an n-type dopant;
      a second layer of boron nitride carbon alloy nanotubes having a p-type dopant, the second layer in contact with the first layer to form a first p-n junction,
      a third layer of boron nitride carbon alloy nanotubes having an n-type dopant, the third layer in contact with the second layer to form a second p-n junction; and
      a fourth layer of boron nitride carbon alloy nanotubes having a p-type dopant, the fourth layer in contact with the third layer to form a third p-n junction, wherein
      a first band gap of the first layer, a second band gap of the second layer, a third band gap of the third layer, and a fourth band gap of the fourth layer are each determined by a corresponding carbon content of the alloy of the first layer, the second layer, the third layer, and the fourth layer, respectively.

2. The solar cell of claim 1, wherein an interface between the second layer and the third layer converts a first range of light wavelengths into electricity, the first range of wavelengths transmitted through the first layer and the second layer.

3. The solar cell of claim 1, wherein the solar cell can convert three separate wavelengths of light to electricity, the three separate wavelengths of light spaced from one another by at least 100 nm.

4. The solar cell of claim 1, wherein an efficiency of the solar cell is greater than 50%.

5. The solar cell of claim 1, wherein the first layer and the second layer transmit greater than 50% of light in a range of from 400 to 700 nm.

6. The solar cell of claim 1, wherein the boron nitride carbon alloy nanotubes of the first layer and the second layer comprise:
   boron atoms and nitrogen atoms arranged in an array of hexagonal unit cells; and
   carbon atoms substituted for at least one of a first portion of boron atoms and a second portion of nitrogen atoms.

7. The solar cell of claim 6, wherein lattice parameters of a hexagonal unit cell changes less than 5% upon substitution of a carbon atom for either one of a boron atom or a nitrogen atom.

8. The solar cell of claim 6, wherein carbon atoms are disposed at a lattice site formerly occupied by one of a boron atom and a nitrogen atom.

9. The solar cell of claim 6, wherein carbon atoms are not disposed at interstitial sites of a boron nitride nanotube crystal.

10. The solar cell of claim 1, wherein the solar cell has a density of less than 1.0 g/cc.

11. The solar cell of claim 1, wherein the solar cell is a non-planar solar cell.

12. The solar cell of claim 11, wherein the non-planar solar cell has at least one arcuate portion.

13. The solar cell of claim 1, wherein one of the boron nitride carbon alloy layers comprises at least twice the carbon content of another boron nitride carbon alloy layer of the solar cell.

14. The solar cell of claim 1, wherein the solar cell has an efficiency of converting sunlight to electricity of greater than 20%.

15. The solar cell of claim 1, further comprising a housing, a front sheet and a back sheet.

\* \* \* \* \*